(12) United States Patent
Krishnan

(10) Patent No.: US 6,625,765 B1
(45) Date of Patent: Sep. 23, 2003

(54) MEMORY BASED PHASE LOCKED LOOP

(75) Inventor: Rengarajan S. Krishnan, Bangalore (IN)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/538,989

(22) Filed: Mar. 30, 2000

Related U.S. Application Data

(60) Provisional application No. 60/127,207, filed on Mar. 31, 1999.

(51) Int. Cl.[7] .................. G11C 29/00; G01R 13/02; H03B 21/00; H03L 7/06
(52) U.S. Cl. .................. 714/718; 714/740; 324/76.83; 327/5; 327/106; 327/156
(58) Field of Search ................ 714/699, 740, 714/744, 718, 763; 331/25, 44; 324/76.82, 76.83; 327/5, 106, 156; 375/359, 371, 373, 375, 376

(56) References Cited

U.S. PATENT DOCUMENTS

| | | | | |
|---|---|---|---|---|
| 4,165,541 A | * | 8/1979 | Varshney et al. ............ 257/221 |
| 4,272,729 A | * | 6/1981 | Riley, Jr. .................... 331/1 A |
| 5,684,795 A | * | 11/1997 | Daniel et al. ................ 370/347 |
| 5,859,570 A | * | 1/1999 | Itoh et al. .................... 327/106 |
| 6,101,197 A | * | 8/2000 | Keeth et al. ................. 370/503 |
| 6,201,423 B1 | * | 3/2001 | Taguchi et al. ............. 327/141 |
| 6,337,589 B1 | * | 1/2002 | Ooishi ........................ 327/156 |
| 6,415,007 B1 | * | 7/2002 | Kawasumi ................. 375/374 |

* cited by examiner

Primary Examiner—Albert Decady
Assistant Examiner—Matthew C. Dooley
(74) Attorney, Agent, or Firm—Christopher P. Maiorana, P.C.

(57) ABSTRACT

A circuit comprising a phase detector/correction circuit, at least one column of memory cells, a control circuit and a sense amplifier. The control circuit may be configured to read a sequence from the memory cells in a predetermined order and present a first output signal. The sense amplifier may be configured to present a periodic signal in response to the first output signal.

20 Claims, 6 Drawing Sheets

MEMORY BASED PHASE LOCKED LOOP

CROSS REFERENCE TO RELATED APPLICATIONS

This application claims the benefit of U.S. Provisional Application No. 60/127,207, filed Mar. 31, 1999 and is hereby incorporated by reference in its entirety.

FIELD OF THE INVENTION

The present invention relates to a phase locked loops generally and, more particularly, to a memory based phase locked loop.

BACKGROUND OF THE INVENTION

Phase Locked Loops (PLLs) generally comprise the functional blocks of a delay locked loop and an edge corrector/Voltage Controlled Oscillator (VCO). Conventional approaches are to design these components around specialized analog circuits and counters/dividers using digital logic. The important parameters to control are the duty cycle and jitter on the final clock output across process, power supply and temperature variations.

SUMMARY OF THE INVENTION

The present invention concerns a circuit comprising a phase detector/correction circuit, at least one column of memory cells, a control circuit and a sense amplifier. The control circuit may be configured to read a sequence from the memory cells in a predetermined order and present a first output signal. The sense amplifier may be configured to present a periodic signal in response to the first output signal.

The objects, features and advantages of the present invention include providing a phase locked loop that may (i) adjust the frequency of oscillation of the PLL with memory cell(s) that may be "trimmed" with separate memory columns during a test phase, (ii) not require a "warm-up" time to establish locking, (iii) be implemented with a variety of memory cell architectures and/or (iv) implement a wide frequency selector range.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
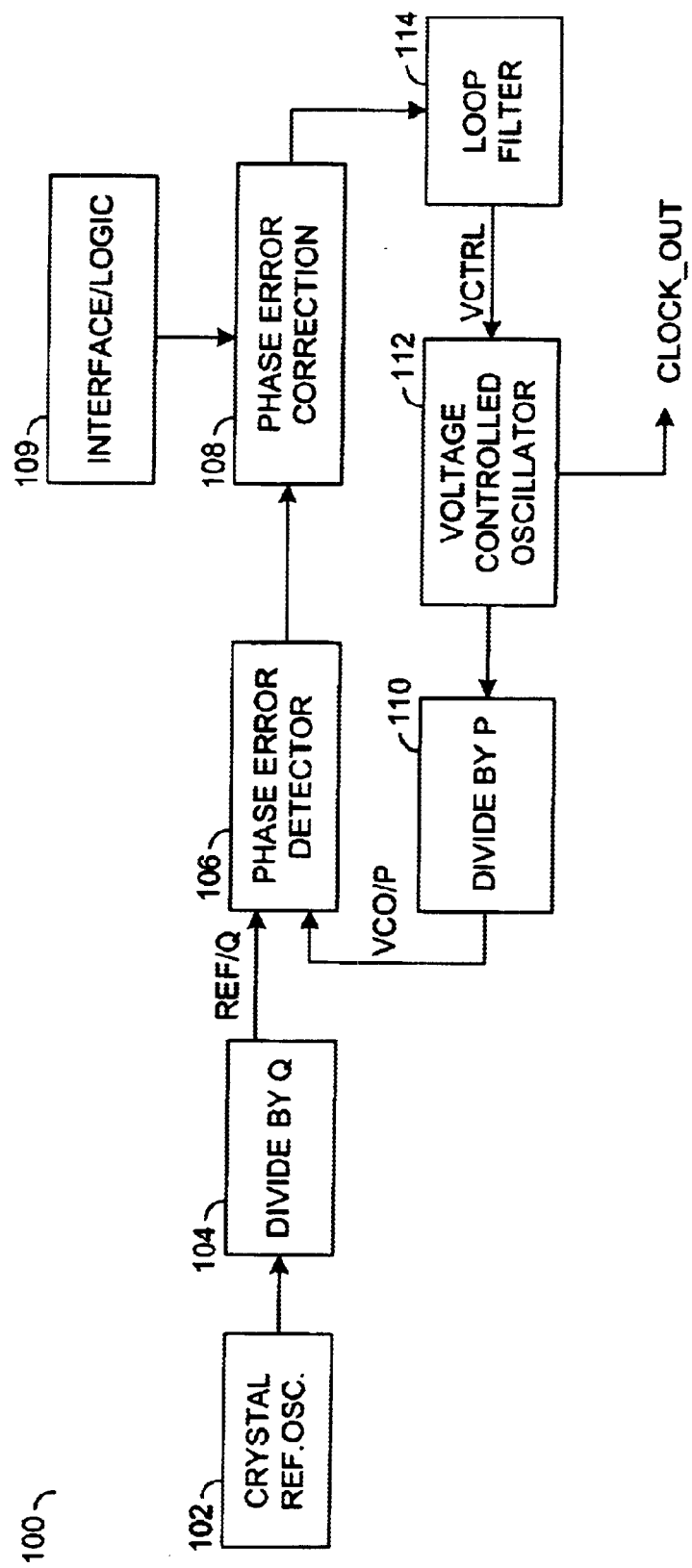
FIG. 1 is a block diagram of a preferred embodiment of the present invention illustrated in a frequency synthesizer application.

Referring to FIG. 1, a block diagram of a circuit 100 is shown incorporating a preferred embodiment of the present invention. The circuit 100 generally comprises a crystal reference oscillator block (or circuit) 102, a divide block (or circuit) 104, a phase error detector block (or circuit) 106, a phase error correction block (or circuit) 108, an interface/logic block 109, a divider block (or circuit) 110, a voltage controlled oscillator (VCO) 112 and a loop filter block (or circuit) 114. The divider blocks 104 and 110 may be implemented, in one example, as counters. The voltage controlled oscillator 112 may be implemented, in one example, having an odd number of inverters at an input. The circuit 100 may provide filtering in the phase error correction block 108. The function of the loop filter may be achieved as part of a bit-line swing control.

Figure 2:
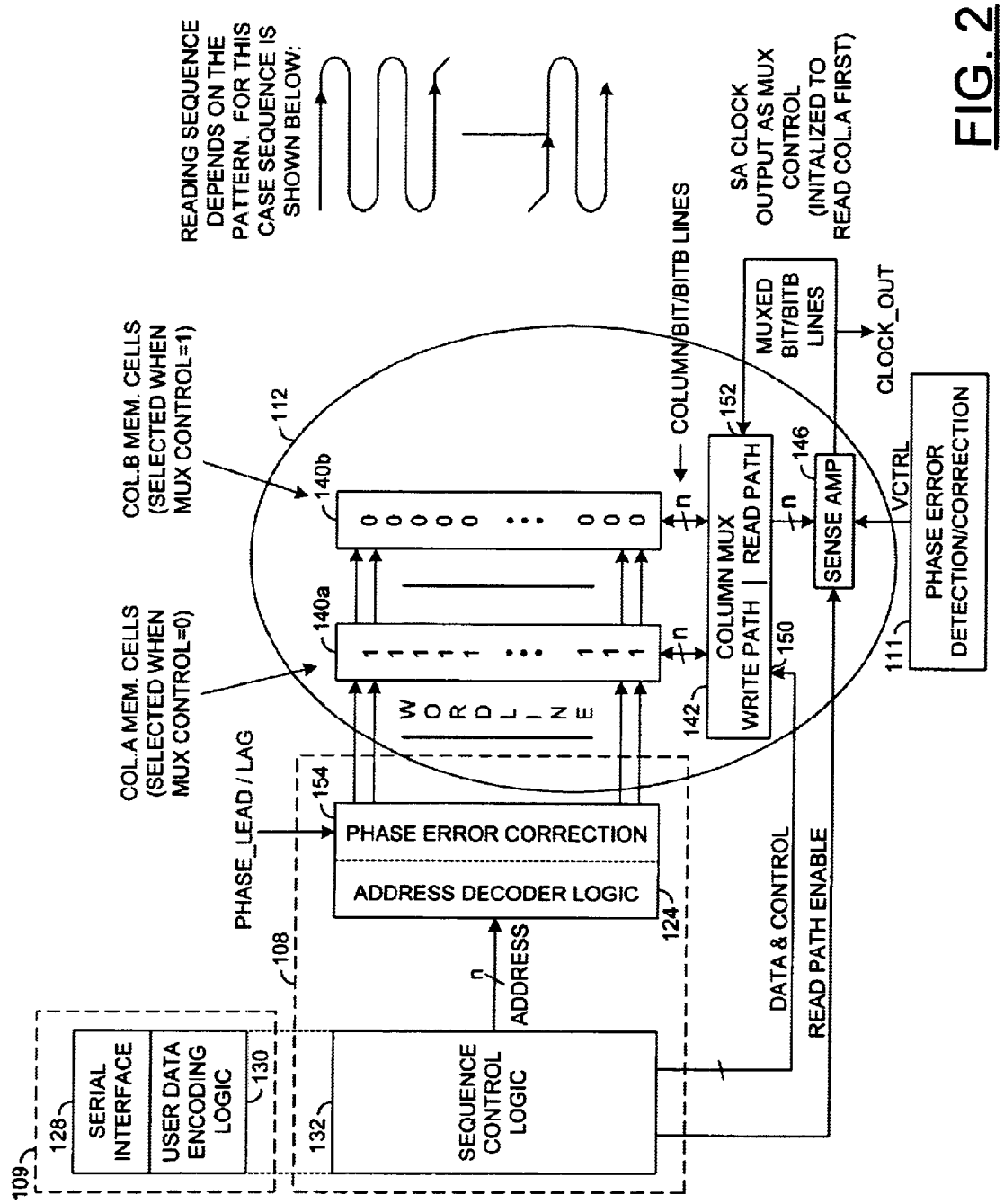
FIG. 2 is a diagram of the VCO of FIG. 1 along with an example of a control circuit.

Referring to FIG. 2, a more detailed example of the circuits 108, 109 and 112 of the circuit 100 of FIG. 1 is shown. A phase error detection/correction block (or circuit) 111 is also shown. The user interface block 109 may comprise a serial interface 128 and an encoding logic block (or circuit) 130. The phase error correction block 108 may comprise a sequence control logic block (or circuit) 132 and a phase error correction/address decode block 124. The serial interface 128 may receive user inputs and may store the inputs in one or more internal control and data registers (not shown). The data encoding logic block 130 may store the information received from the interface block 128 after converting the information to a pattern to be stored in a column of memory columns 140a–140b. Alternately, the data encoding block 130 may present information on the fly during cell write. For example, a WRITE may be done as follows (i) enable word lines of a column where 1's are to be written or (ii) write all the 1's in one stroke similarly for 0's, then do the same for next column. The control logic 132 needs to set up the address inputs accordingly. The address decoder 124 generally provides for multiple word line addresses. A WRITE sequence may be initiated after a power on reset (POR) (or other user initiated signal) to write the patterns to the cells of the memory columns 140a–140b. The sequence control logic 132 may generate a signal DATA, a signal CONTROL and a signal ADDRESS. The signal ADDRESS may be presented to the phase error correction block 124 and may increment after each read/write operation. The signal DATA and a signal WRITE may be a pattern derived from the encoding logic 130. The actual read/write sequencing may be accomplished with a state machine or other suitable logic circuit.

The phase error correction block 124 may provide a digital adjustment to phase errors on the output signal CLOCK_OUT in response to a control signal (e.g., PHASE_LEAD/LAG), to be described in more detail in connection with FIG. 4. The phase error correction block 111 (to be described in more detail in connection with FIG. 5) may provide an analog adjustment to phase errors on the output signal CLOCK_OUT. The present invention may implement either the phase error correction block 124, the phase error correction block 111, or a combination of both to meet the design criteria of a particular implementation.

The VCO 112 generally comprises the column of memory cells 140a and the column of memory cells 140b. In one example, the columns of memory cells 140a and 140b may be implemented as Static Random Access Memory (SRAM) cells. However, other cells may be implemented accordingly to meet the design criteria of a particular implementation. In general, the column of memory cells 140a may be selected when a multiplexer control signal is equal to zero and the column of memory cells 140b may be selected when the multiplexer control signal is equal to one.

Figure 3:
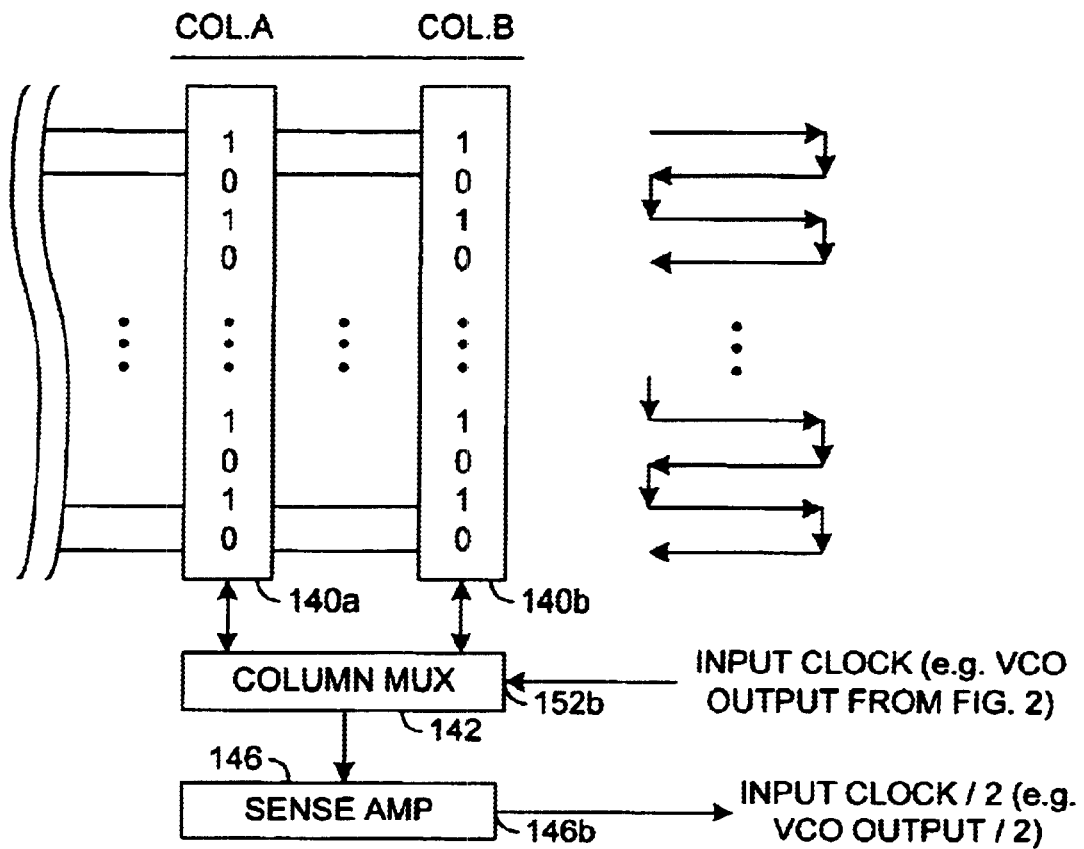
FIG. 3 is an example of an alternate programming of the circuit of FIG. 2.

Referring to FIG. 3, the pattern stored in the column of memory cells 140a–140b is 1010 . . . 1010 and the signal CLOCK_OUT from FIG. 2 is used as a multiplexer control signal received at an input 152b. The signal presented at the output 146b would generally be a DIV/2 signal of the signal received at the input 152b. By manipulating the stored pattern, a wide range of sub-multiples of a given clock may be implemented. Additionally, duty cycle may be changed by manipulating the pattern stored. Thus, FIG. 3 generally implements an example of a divider. For example, a signal REF/Q and VCO/P for the phase detector 16 may be derived from such circuits.

Referring back to FIG. 2, the ring oscillator portion of the VCO 112 may be implemented as a two column array (e.g., columns A and B) that may be multiplexed into the sense amplifier 146. The output of the sense amplifier 146 may present the signal CLOCK_OUT that may also be used, in one example; as a feedback to control the multiplexer 142. Thus, the columns A and B may be accessed alternatively. By "programming" the cells in the columns with "desired values" (e.g., the high and low periods), the frequency of the signal CLOCK_OUT may be controlled. For example, "1"s in column A and "0"s in column B may result in a 50% duty cycle output at the maximum possible frequency. The cells in the columns would be accessed from Row0 to RowN and then cycle back to Row0, where N is a predetermined number based on the sequence that is programmed.

The frequency oscillation of the signal CLOCK_OUT may be defined by the following equation:

$$CLOCK\_OUT = (P)*(REF/Q) \quad\quad EQ1$$

The signal REF may be the input crystal frequency presented by the circuit 102. The signal CLOCK_OUT/P may be the signal compared with REF/Q for error detection by the phase error detector 106. The signal REF/Q may be achieved by "programming" the desired values for a Div/Q. The multiplexer 142 may be controlled by the signal REF or the output of the sense amplifier 146.

Figure 4:
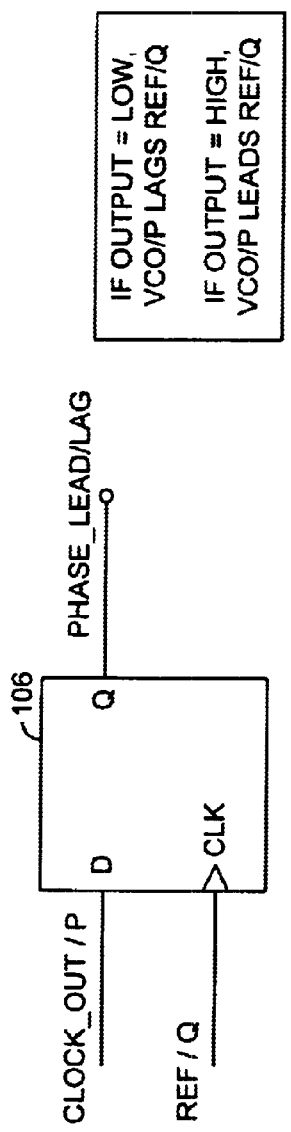
FIG. 4 is a diagram of an equalization circuit that may present a signal to the phase error correction/address decode block of FIG. 2.

Referring to FIG. 4, an example of an error detection circuit 106 is shown that may present the signal PHASE_LEAD/LAG at the input 154. A positive edge triggered D flip-flop may receive an input REF/Q as the clock input and the signal CLOCK_OUT/P as a D-input. The signal PHASE_LEAD/LAG may be LOW after the REF/Q edge, which may indicate that the signal REF/Q leads the CLOCK_OUT/P and vice versa.

The circuit 100 may provide edge correction based on the output of the error detection circuit 106. For example, the sense amplifier output transition may be advanced (or delayed) by aiding (or impeding) the bitline swing at the input to the sense amplifier 146. This tends to align the edges of the signals REF/Q and CLOCK_OUT/P. Adjusting the signal CLOCK_OUT presented by the sense amplifier 146 may be implemented by one or more of the following: (i) optioning in (or out) one or more rows of cells, (ii) optioning out (or in) equalization transistors between the bitlines BIT/BITB, and/or (iii) increasing (or decreasing) the current of the sense amplifier 146. Such adjustments may increase/decrease the frequency (e.g., locking/tracking) of the circuit 100.

The circuit 100 generally programs the active cells of the memory 126 by the user interface 122. Such programming may be a done through (i) a serial interface to receive cell addresses and data (ii) a circuit that converts byte information into the "desired" patters and/or (iii) a logic circuit that may address and write to the SRAM cells.

The present invention may provide a high level of jitter performance by providing the differential input sense amplifier 146 with a high Power Supply Rejection Ratio (PSRR) and a high Common Mode Rejection Ratio (CMRR). Since the circuit 100 may be a memory based implementation, the area needed for implementation may be minimal.

Figure 5:
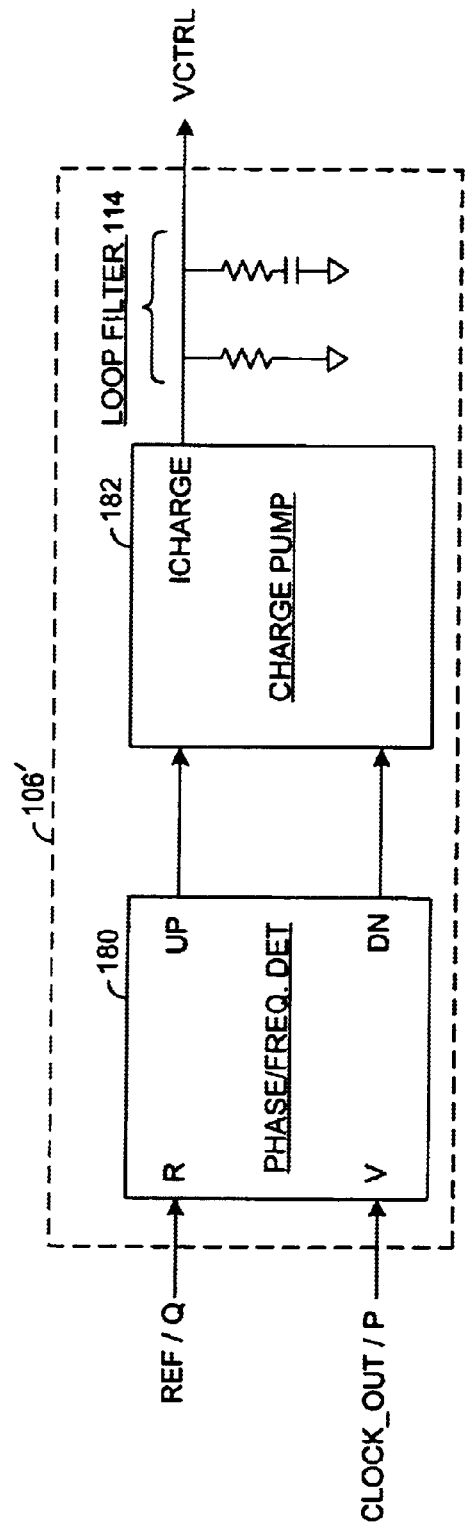
FIG. 5 is a block diagram; of an example of an analog phase error detector circuit of FIG. 2.

Referring to FIG. 5, an example of the phase error correction circuit 111 is shown. The phase error detection circuit 111 may be an analog control circuit. The circuit 111 may determine the phase difference between the signal REF/Q and the signal VCO/P such that a proportionate correction (as opposed to the discrete correction described in connection with FIG. 3) is applied. The circuit 111 generally comprises a phase/frequency detector 180, a charge pump 182 and a loop filter 114.

The phase/frequency detector 180 may generate a signal (e.g., UP) if the signal R leads the signal V and signal (e.g., DN) when the signal R lags the signal V. The signal UP and the signal DN are generally mutually exclusive signals. The charge pump 182 may charge/discharge the signal VCTRL based on the signal(s) UP/DN. The loop filter 114 may reduce the ripple on the signal VCTRL. The signal VCTRL controls the VCQ output frequency. In general the higher the voltage of the signal VCTRL, the higher the frequency of oscillation of the signal CLOCK_OUT.

Figure 6:
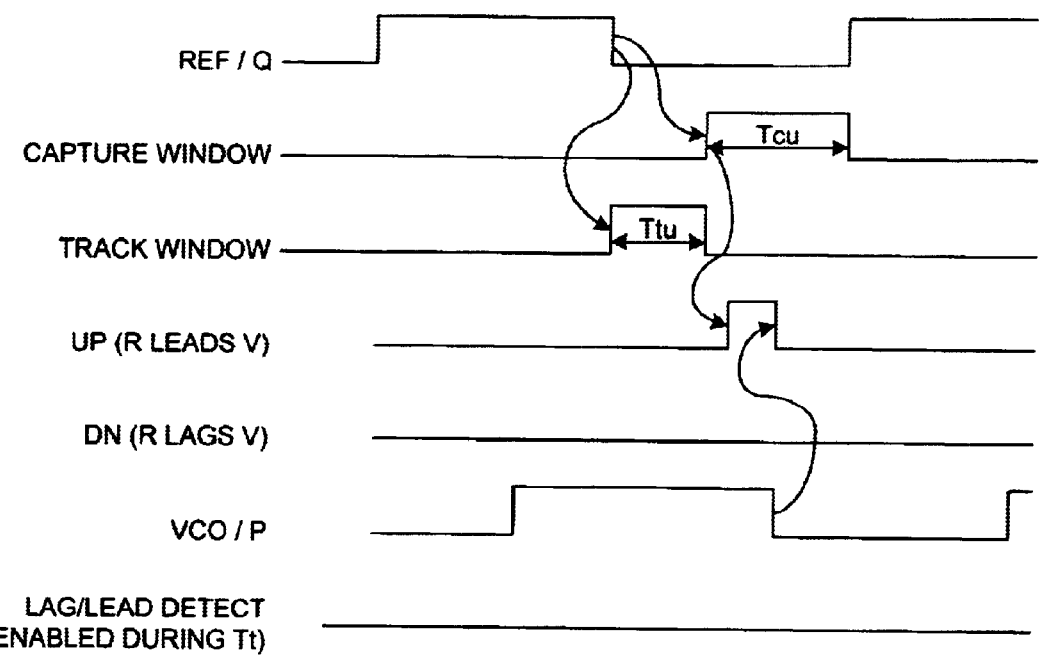
FIG. 6 is a timing diagram illustrating a case where the reference clock/Q leads the VCO/P signal.
Figure 7:
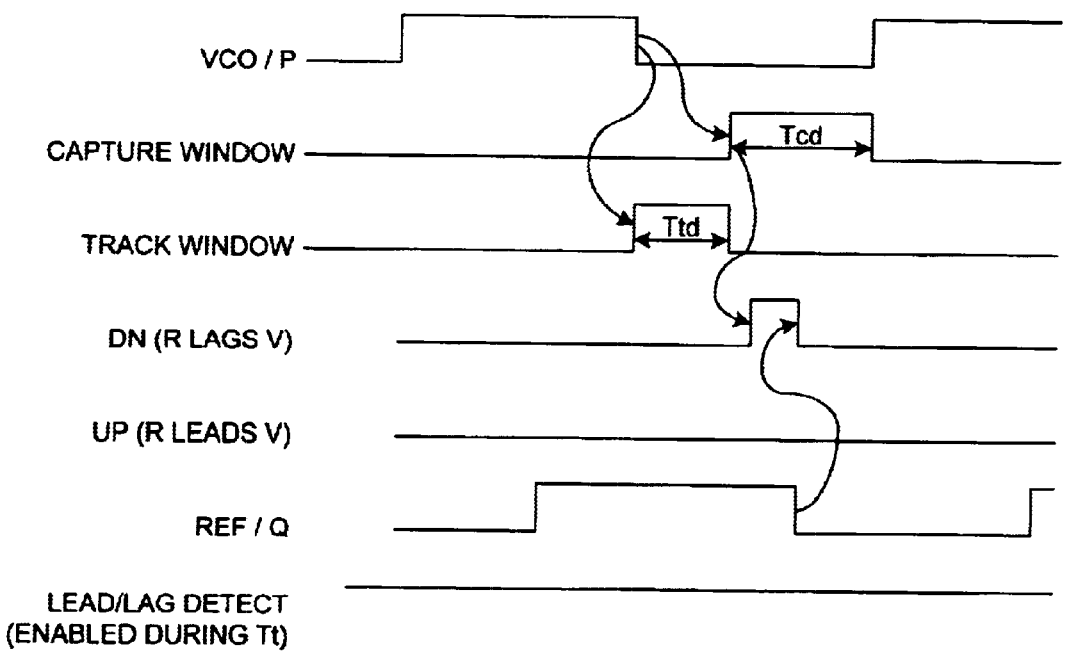
FIG. 7 is a timing diagram of a case where the signal VCO/P leads the signal REF/Q.

An example of the operation of the phase frequency detector 180 is illustrated in FIG. 6 and FIG. 7. FIG. 6 illustrates a case where the signal R leads the signal V. A capture window (e.g., Tcu) and tracking window (e.g., Ttu) are illustrated. Both the windows are defined around the falling edge of the window R, so that the subsequent positive transition of the edges of the signal R or V may have the benefit of phase/frequency correction. The capture window (Tcu) may provide "coarse" correction and the tracking window (Ttu) may be used to achieve tight control on the phase alignment The waveforms in FIG. 6 are generally used in the capture window (Tcu). A combination of the following techniques may be used for such analog control (i) the, signal VCTRL may be used to control the sense amp bias current, (ii) the signal VCTRL may be used to control the equalization on the VCO bitlines BIT/BITB. A higher voltage on the signal VCTRL would generally decrease the equalization, and hence increase (in the example of PMOS transistors) the frequency. This may be particularly useful in the example where PMOS equalization devices are used. This equalization generally alters the frequency and phase of the signal CLOCK_OUT.

Another discrete correction method may be implemented by the optioning in/out of more cells in parallel. The phase error signal presented to the input 154 may be used as a direction input (e.g., 0=Decrement, 1=Increment), for a correction counter in the phase error correction circuit 108 (see FIG. 8). The counter may be clocked by the rising edge of the signal Tt. The output bits of the counter may be used to option in/out parallel cells. Since parallel cells generally affect bitline swing by small amount, this method provides a tight control.

Figure 8:
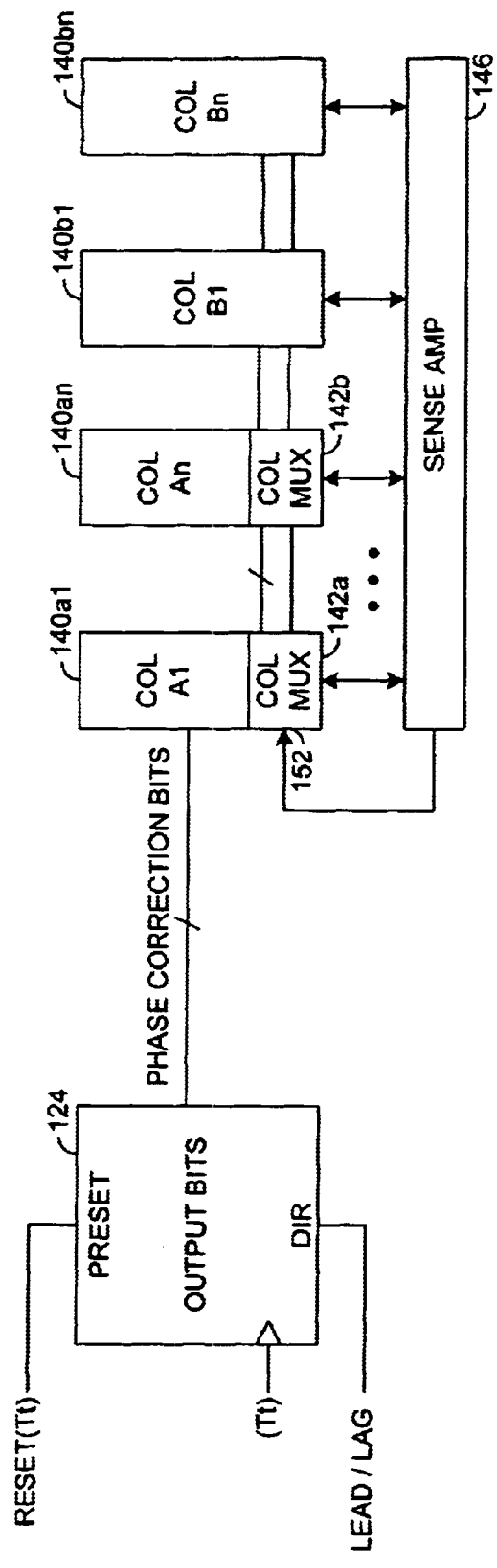
FIG. 8 is an example of a phase correction signal in conjunction with the circuit of FIG. 2.

Referring to FIG. 8, an example of the circuit 100 is shown where the values stored in COLA (and COLB) represent a group of parallel columns, the column multiplexer 142 may be controlled as defined by the following equation:

$$\text{Column Control} = AND\{VCOb \text{ output of ColB, Column Correction-bit}\} \quad\quad EQ2$$

In general, all of the, parallel columns may be multiplexed into the same sense amplifier 146 with the output being the signal CLOCK_OUT. Each correction bit may control each column. In such an example, the bit line swing at the input of the sense amplifier 146 may be modified, resulting in a change in frequency and/or phase of the signal CLOCK_OUT.

The present invention may result in changing the bitline swing to a new value until the next correction. By resetting the counter to a default value after the window Tt, the correction may be applied only during the window Tt, thus providing a fine control. The "parallel" columns that are used for correction may be designed such that they only incrementally modify the bitline swing at the input of the sense amplifier 146.

The present invention may provide a wide frequency selection range. For example, the frequency of oscillation of the signal CLOCK_OUT may have an almost unlimited choice of frequencies up to the maximum frequency limit of the circuit. This is in contrast to a limited choice of factory programmed settings in conventional circuits. Additionally, submultiples of a reference signal may be configurable for almost any division, as opposed to only hardcoded divisions (e.g. Clock/2, Clock/3 etc.) in conventional circuits.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   at least one column of memory cells;
   a control circuit configured to read a sequence from the memory cells in a predetermined order and present a first output signal;
   a sense amplifier configured to present a periodic signal in response to the first output signal and a first control signal; and
   a phase detector/correction circuit configured to (i) receive a first reference signal and a first feedback of said periodic signal, and (ii) generate said first control signal.

2. The circuit according to claim 1, where said control circuit reads said sequence in response to said periodic signal, a second feedback of said periodic signal, or a second reference signal.

3. The circuit according to claim 1, wherein said first control signal provides phase correction by controlling a sense amplifier bias current.

4. The circuit according to claim 1, further comprising a second column of memory cells and a plurality of bitlines, and said control circuit comprises a multiplexer configured to present said first output signal from said plurality of bit lines.

5. The circuit according to claim 1, further comprising an array, wherein said array comprises:
   a plurality of rows;
   a first group of columns comprising said at least one column of memory cells; and
   a second group of one or more columns, wherein one or more of the columns are written to in response to one or more second control signals, and wherein the number of columns enabled in said first group and said second group change a bitline swing presented to the sense amplifier.

6. The circuit according to claim 5, wherein said first control signal comprises an analog adjustment signal.

7. The circuit according to claim 6, wherein said phase detector/correction circuit is further configured to generate one or more digital adjustment signals.

8. The circuit according to claim 1, wherein said control circuit comprises a decoder.

9. The circuit according to claim 2, further comprising a second column of memory cells, and said control circuit comprises a multiplexer configured to select one of said columns in response to said periodic signal, said second feedback of said periodic signal or said second reference signal.

10. The circuit according to claim 6, wherein said phase detector/correction circuit comprises:
    a phase detector receiving said first reference signal and said first feedback of said periodic signal, and presenting a digital adjustment signal; and
    a phase error correction circuit configured to generate said analog adjustment signal.

11. The circuit according to claim 1, wherein said at least one column of memory cells each comprise static random access memory cells.

12. The circuit according to claim 2, wherein said phase detector/correction circuit comprises a counter.

13. A circuit comprising:
    means for programming a series of memory cells with data defining a programmable frequency of a periodic signal;
    means for sequentially reading the cells to generate an output signal; and
    means for generating said programmable frequency from said output signal using circuitry comprising a sense amplifier.

14. A method for generating a signal having a programmable frequency comprising the steps of:
    (A) programming a series of memory cells with data defining the frequency;
    (B) reading the cells sequentially to generate an output signal; and
    (C) generating the programmable frequency signal from the output signal using circuitry comprising a sense amplifier.

15. The method according to claim 14, where the cells are read sequentially in response to said programmable frequency signal, a feedback of said programmable frequency signal, or a reference signal.

16. The method according to claim 14, further comprising modifying a bit line swing at an input of the sense amplifier to change the frequency and/or a phase of the programmable frequency signal.

17. The method according to claim 14, wherein step (A) further comprises the substeps of:
    (A-1) (i) enabling a first predetermined value of one or more first word lines of said series of memory cells or (ii) writing to said one or more first word lines said first predetermined value; and
    (A-2) (i) enabling a second predetermined value of one or more second word lines of said series of memory cells or (ii) writing to said one or more second word lines said second predetermined value.

18. The circuit according to claim 14, wherein step (A) is responsive to one or more addresses.

19. The method according to claim 14, further comprising the step of:
    (D) providing phase correction for said programmable frequency signal by adjusting a sense amplifier bias current.

20. The method according to claim 19, wherein step (D) is responsive to an analog adjustment signal.

* * * * *